United States Patent [19]

Kitagawara et al.

[11] Patent Number: 5,228,927
[45] Date of Patent: Jul. 20, 1993

[54] METHOD FOR HEAT-TREATING GALLIUM ARSENIDE MONOCRYSTALS

[75] Inventors: Yutaka Kitagawara; Susumu Kuwahara; Takao Takenaka, all of Gunma, Japan

[73] Assignee: Shin-Etsu Handotai Company Limited, Japan

[21] Appl. No.: 677,036

[22] Filed: Mar. 29, 1991

Related U.S. Application Data

[62] Division of Ser. No. 327,491, Mar. 23, 1989, abandoned.

[30] Foreign Application Priority Data

Mar. 25, 1988 [JP] Japan ................. 63-69733

[51] Int. Cl.$^5$ .......................... H01L 29/30
[52] U.S. Cl. .................. 148/33.2; 437/248;
    437/939; 437/10; 148/33.2; 148/DIG. 24;
    148/DIG. 3; 148/DIG. 56
[58] Field of Search ............. 437/248, 976, 247, 22,
    437/939, 10; 148/DIG. 3, DIG. 4, DIG. 24,
    DIG. 56, DIG. 65, 33.2

[56] References Cited

U.S. PATENT DOCUMENTS

| | | | |
|---|---|---|---|
| 3,729,348 | 4/1973 | Saul | 437/247 |
| 4,376,657 | 3/1983 | Nagasawa et al. | 437/10 |
| 4,851,358 | 7/1989 | Huber | 437/10 |
| 4,868,133 | 9/1989 | Huber | 437/10 |
| 4,889,493 | 12/1989 | Otsuki et al. | 437/248 |
| 5,051,376 | 9/1991 | Yamada et al. | 437/247 |

FOREIGN PATENT DOCUMENTS

| 176130 | 4/1986 | European Pat. Off. |
| 1-102932 | 4/1989 | Japan |
| 2137524 | 10/1984 | United Kingdom |

OTHER PUBLICATIONS

McGuigan et al, "Growth and Properties of Large-Diameter Indium Lattice-Hardened GaAs Crystals", Journal of Crystal Growth, vol. 76, No. 2 (Aug. 1986), pp. 217-232 (pp. 226-227, Section 2.5).
Patent Abstracts of Japan, vol. 11, No. 200 (C-432) [2647], Jun. 27, 1987.
Patent Abstracts of Japan, vol. 11, No. 267 (C-443) [2714], Aug. 28, 1987.
Patent Abstracts of Japan, vol. 12, No. 5 (C-467) [92852], Jan. 3, 1988.

Primary Examiner—Brian E. Hearn
Assistant Examiner—Tuan Nguyen
Attorney, Agent, or Firm—Lowe, Price, LeBlanc & Becker

[57] ABSTRACT

A heat-treating method for an indium-doped dislocation-free gallium arsenide monocrystal having a low carbon concentration and grown in the Liquid Encapsulated Czochralski method, comprising a two-step heat treatment:
(i) heating the monocrystal at a temperature between 1050° C. and 1200° C. for a predetermined time length, and cooling the monocrystal quickly; and
(ii) heating the monocrystal at a temperature between 750° C. and 950° C. for a predetermined time length, and cooling the monocrystal quickly.

1 Claim, 3 Drawing Sheets

METHOD FOR HEAT-TREATING GALLIUM ARSENIDE MONOCRYSTALS

This application is a divisional application of application Ser. No. 07/327,491, filed Mar. 23, 1989 now abandoned.

BACKGROUND OF THE INVENTION

The present invention relates to a method for heat-treating indium-doped dislocation-free gallium arsenide monocrystal with a view to improve properties of the gallium arsenide monocrystals.

Gallium arsenide monocrystal is grown horizontally by the horizontal Bridgman's method or vertically by the liquid encapsulated Czochralski (LEC) method. The monocrystal body obtained by means of the latter method is generally cylindrical except at the end portions (FIG. 4) so that wherever the body is cut by a plane normal to the axis of the body the cross section of the body is circular. This is propitious for obtaining circular wafers, which are the industrial standard wafers and are, therefore, acceptable as they are to the device processing lines where the wafers are further processed. Also the liquid encapsulated Czochralski method is regarded very highly for the facts that it is easier to render a wafer dislocation-free in this method and that it is relatively easy to obtain monocrystal gallium arsenide wafers of relatively large diameters in this method.

The gallium arsenide monocrystal is extensively used as a material to make substrates for various devices such as light emitting diode, light sensing device (i.e., light detector), devices for microwave communication system. Since the electron mobility is far greater in gallium arsenide monocrystal than it is in silicon semiconductor, the development of the substrates for integrated circuits having high electron mobility has become very active recently. Therefore, to reduce the density of or to completely eliminate the existence of the dislocation in gallium arsenide monocrystal is an increasingly acute subject of many researchers in this field of technology.

Incidentally, it is generally accepted that the stresses exerted on a crystal grown from the melt by a thermal shock is a chief cause of dislocations in the crystals.

As a result of the efforts made with the view of obtaining dislocation-free gallium arsenide monocrystal, various techniques have been developed to render the gallium arsenide monocrystal dislocation-free, and among them are procedures specially applicable in the liquid encapsulated Czochralski method. An example of the procedures usefully adopted in the liquid encapsulated Czochralski method is disclosed by B. C. Grabmaier et al., in Journal of Crystal Growth 13/14 635-639 (1972). According to the disclosure, the increase in dislocation density caused by sealing or a seal crystal itself in the grown crystal especially in the vicinity of the seed crystal/grown crystal interface is hindered by means of necking, which is a procedure comprising growing a 10 to 20 mm-long thin monocrystal portion having a diameter of 1 or 2 mm from the seed, and adopting a small temperature gradient at the seed crystal/grown crystal interface.

As a method for decreasing the dislocation density in gallium arsenide monocrystal, a technique is proposed wherein additives such as Si, Te, Sb, Al, In, and B are added to the gallium arsenide monocrystal. According to the method, these additives have a tendency of adhering to the dislocations as the dislocations develop in the growing crystal whereby the propagation and growth of the dislocations are prevented. Among the additives, indium has proved a successful dopant for industrially obtaining a dislocation-free gallium arsenide monocrystal. According to an example disclosed in Japanese Kokai No. 61-222991, it is possible to obtain dislocation-free gallium arsenide monocrystal without applying necking operation, if a molten gallium arsenide containing indium in an amount of about 6 weight % is prepared in a quartz crucible to be employed as the melt, and the seed to raise the monocrystal from the melt is doped with indium in an amount of 0.7 weight %. More generally, Japanese Kokai No. 61-222991 teaches that to obtain dislocation-free gallium arsenide monocrystal the seed should be doped with indium as much as kC weight % where k is a segregation coefficient of indium and C is the concentration of indium in the melt of gallium arsenide.

The indium-doped dislocation-free gallium arsenide monocrystal thus obtained is certainly free of dislocations, and from this fact it appears that the gallium arsenide is crystallographically uniform. However, it has been observed that thus grown indium-doped dislocation-free gallium arsenide monocrystal rod, as it is, exhibits ununiformity in axial direction in such respects as electric properties, the concentrations of traps such as EL2, the concentration of carbon that substituted arsenic, and occurrence of the micro precipitates. Even if such a monocrystal is in semi-insulation state, the monocrystal substrates cut therefrom will be such that when they are made into transistors by means of the ion-implantation procedure, the resulting transistors have inconsistent threshold voltages Vth, which determine the on-off positions in switching action.

An In-doped dislocation-free gallium arsenide monocrystal is ordinarily obtained by the liquid encapsulated Czochralski (LEC) method. As shown in FIG. 3, the liquid encapsulated Czochralski method employs a pressurized chamber (furnace) schematically drawn by the frame designated by 1, and this pressurized chamber 1 is filled with an inert gas. A PBN (pyrolytic boron nitride) crucible 2 is installed in the middle of the chamber 1 such that the crucible 2 is capable of being rotated around its center line by means of a shaft. Reference numeral 3 designates an In-doped melt of gallium arsenide contained in the crucible 2. The surface of the melt 3 is entirely covered with a layer of another melt 4, which is of $B_2O_3$ whereby the melt 3 is sealed from the gaseous environment. A heating means 5 is provided to controllably heat the melt 3. The seed is lowered to the melt 4 and, penetrating the layer of the melt 4, it is caused to touch the surface of the melt 3. Then, while the crucible is slowly rotated by the shaft in the direction indicated by a curved arrow below (FIG. 3), the seed is moved upward very slowly as it is rotated in the opposite direction as indicated by a curved arrow above. The monocrystal grows from the lower tip of the seed as the seed is raised, and a monocrystal ingot 10 as shown in FIG. 4 is obtained in the end. In FIG. 3, reference numeral 6 designates a heat shield.

The In-doped dislocation-free monocrystal ingot or rod 10 thus obtained tends to have inconsistent properties along the axial direction, as stated above, and it is postulated that this is a result of the fact that the thermal history experienced by different portions of the monocrystal rod is not always the same. Especially the conditions under which the cooling process is conducted are difficult to maintain fixed or uniform in time with respect to the different portions of the monocrystal rod.

Koji Yamada et al reported in their preparatory treatise for the 47th Autumn Season Applied Physics Symposium, 22a-K-8 (1986), that as they analyzed an In-doped gallium arsenide monocrystal rod grown by the LEC method by means of the infrared transmission method (IRT) as well as the KOH etching method, they observed the existence of microdefects which were not dislocation in the monocrystal rod. Further, they reported in their preparatory treatise for the 34th Spring Season Applied Physics Symposium, 30a-Z-3 (1987), that the formation of the same microdefects was strongly dependent upon the thermal history below 1000° C.

These reports showed that there exist microdefects which are not dislocations and are distributed ununiformly, in the In-doped dislocation-free gallium arsenide monocrystal rod and that the formation of the microdefects is affected by the thermal history during the monocrystal pulling-up operation. However, there has been disclosed no solution for making the distribution of the microdefects uniform throughout the monocrystal rod nor for eliminating the microdefects.

It is an object of the invention, therefore, to provide a method for thermally treating an indium-doped dislocation-free gallium arsenide monocrystal rod which method is capable of making homogeneous in the axial direction of the monocrystal rod the electric properties such as resistivity, the concentrations, i.e., the densities of deep traps such as EL2, the concentration of carbon that substituted arsenic at arsenic sublattice site ($C_{As}$), and the density and size of microprecipitates, and thereby producing a gallium arsenide monocrystal from which it is possible to obtain high quality gallium arsenide monocrystal substrates desirous for manufacturing semiconductor devices.

SUMMARY OF THE INVENTION

The present invention, therefore, was contrived with the view of solving above-mentioned problems, and in particular, the invention provides a heat-treating method applicable to the In-doped dislocation-free monocrystal manufactured in the LEC method during or, preferably, after the pulling-up operation. The heat treatment comprises a first and a second heating steps which are conducted consecutively. The first heating step adopts a heating temperature in the range from 1050° C. to 1200° C., and the second step adopts a heating temperature in the range from 750° C. to 950° C.

The first heating step has an effect of "initializing" the properties of the as-grown monocrystal ingot, which is to render the quality of the monocrystal ingot closely resemble that of the same monocrystal ingot immediately after the crystal solidification at the temperature near the melting point. The second heating step is effective to stabilize the electric properties of the monocrystal lest they should be affected during the thermal treatments in the later semiconductor device manufacturing processes. The second heating step is also effective to ensure the electric semi-insulating state of the monocrystal (with a resistivity of $10^7$ Ωcm or higher). The lengths of time for the first and the second heating steps are such that the heating operation is continued for at least half an hour from the moment the heating temperature reaches the respective predetermined values. It is also required that the cooling operation following the first heating step should be conducted drastically at a cooling rate of from $-10°$ to $-200°$ C./minute. Similarly the cooling operation following the second heating step must be conducted such that the cooling rate is from $-10°$ to $-200°$ C./minute until the temperature becomes 300° C. or lower.

Described next will be the manners of inspecting the ununiformity of the monocrystal ingot pulled from the melt, the effects of the first and the second heating steps, and the effects of the controlled cooling rates.

OBSERVATION OF UNUNIFORMITY IN AN AS-GROWN MONOCRYSTAL INGOT

An In-doped dislocation-free gallium arsenide monocrystal ingot (2"φ and 200 mm long) was grown by the conventional pulling-up method and it contained carbon in a concentration of less than $2 \times 10^{15}$ cm$^{-3}$. A sample piece F was taken from the top (or front) portion (in the vicinity of the seed) of the monocrystal ingot, and a sample piece T was taken from the tail portion of the monocrystal ingot. Another In-doped dislocation-free gallium arsenide monocrystal ingot was grown in a manner such that the pulling rate from the moment the seed was connected with the melt until the completion of the upper conical portion of the ingot was at a conventionally adopted rate and that the solidified monocrystal was disconnected from the melt by quickly pulling up the monocrystal at an increased rate of 20 mm/sec. A sample piece C was taken from this monocrystal. The three samples F, T, and C were heated at 950° C. for two hours, and then cooled at a cooling rate of 100° C./minute. The electric resistivity, the concentration of trap level EL2, the carbon concentration ($C_{As}$), and the density of the etching pit given rise to by the microprecipitate were measured before and after the two-hour-long heat treatment at 950° C. (The precipitation pit is the pit which is a recess etched selective at a microprecipitate on or beneath the crystal surface.) The electric resistivity was measured by the van der Pauw method. The EL2 concentration was measured by the near infrared absorption method employing a wave length of 1.1 μm. The carbon concentration ($C_{As}$) was measured by the infrared absorption method with respect to the localized vibration mode in the vicinity of 580 cm$^{-1}$. The precipitation (microdeposit) pit density was measured by the Abrahams-Buiocchi preferential etching (A-B etching) method.

Table 1 shows the results of the measurement of these items before the two-hour heat treatment at 950° C., and Table 2 shows the results of the measurement after the rapid cooling following the two-hour heat treatment. FIG. 5 shows the change in the concentration of EL2 level caused by the two-hour heat treatment at 950° C. and the subsequent rapid cooling.

From the two tables, it is noted that no precipitation pit was observed in Samples T and C not only before but also after the two-hour heat treatment at 950° C. Also it is noteworthy that the concentrations of EL2 of Samples T and C were low before the two-hour heat treatment, but the heat treatment caused them to increase substantially. Also, as a result of the heat treatment and the rapid cooling, these two Samples T and C turned to be n-type semi-insulators. These phenomena are thought to be attributable to the fact that Samples T and C experienced a rapid drop in temperature from 1000° C. or higher down to 300° C. during the crystal pulling operation in the furnace. In contrast with this, as a result of slow cooling during the pulling of the monocrystal ingot, microprecipitates were generated in the monocrystal in the case of Sample F which was taken from the vicinity of the seed of the ingot grown in the conventional manner.

TABLE 1

| Properties before 2-hour heat treatment at 950° C. and rapid cooling | conventional ingot | | conical portion of ingot rapidly disconnected from melt, Sample C |
|---|---|---|---|
| | Sample F | Sample T | |
| precipitation pit density (cm$^{-2}$) | ~1 × 10$^6$ | 0 | 0 |
| resistivity (×10$^7$ Ω cm) | 0.2 (n-type) | 8.0 (n-type) | 0.6 (p-type) |
| [EL2] (×10$^{16}$ cm$^{-3}$) | 1.0 | 0.4 | <0.4 |
| [C$_{As}$] (×10$^{15}$ cm$^{-3}$) | 0.5 | 1.5 | 2.1 |

TABLE 2

| Properties after 2-hour heat treatment at 950° C. and rapid cooling | conventional ingot | | conical portion of ingot rapidly disconnected from melt, Sample C |
|---|---|---|---|
| | Sample F | Sample T | |
| precipitation pit density (cm$^{-2}$) | ~1 × 10$^6$ | 0 | 0 |
| resistivity (×10$^7$ Ω cm) | 6.5 (n-type) | 3.3 (n-type) | 3.1 (n-type) |
| [EL2] (×10$^{16}$ cm$^{-3}$) | 1.0 | 1.2 | 1.7 |
| [C$_{As}$] (×10$^{15}$ cm$^{-3}$) | 0.5 | 1.5 | 2.1 |

THE EFFECT OF THE FIRST-STEP HEAT TREATMENT

Sample F obtained from the vicinity of the seed of the monocrystal pulled in the conventional manner and containing microprecipitates in it was heated at temperatures higher than 1050° C. for a period longer than half an hour. Preferably, this heat treatment should be conducted at temperatures higher than 1100° C. for a period longer than two hours. Then, Sample F was rapidly cooled at cooling rates of from 10° C./minute to 200° C./minute, whereupon the density of the precipitation pits became zero. This phenomenon can be explained by the assumption that the microprecipitates formed in the crystal matrix in the incidental cooling process during the conventional monocrystal pulling-up operation were decomposed by being heated to the high temperature near the melting points of the solidified materials, and thereby the sizes of the microprecipitates became extremely small. These microprecipitates are known to comprise excess arsenic, according to appropriate methods of analysis, and these precipitates are thought to be formed in the crystallographic lattice matrix of the gallium arsenide monocrystal during the crystal pulling operation.

THE EFFECT OF THE SECOND-STEP HEAT TREATMENT

It was found from the experiment described above that in order to turn the entire body of a monocrystal ingot obtained in the conventional manner to be free of microprecipitates, the monocrystal ingot should be heated at temperatures higher than 1050° C. for 30 minutes or longer, or preferably at temperatures higher than 1100° C. for two hours or longer, to thereby decompose the microprecipitates, and, thereafter, the monocrystal ingot should be cooled rapidly so as not to allow recurrence of the microprecipitation. However, as Tables 1 and 2 and FIG. 5 indicate, the gallium arsenide monocrystal obtained through the heat treatment at a temperature near the melting point (≧1050° C.) and the subsequent rapid cooling is so unstable in its resistivity and concentration of EL2 when subjected to a heat treatment in the temperature range from 750° C. to 950° C. that it cannot be said to be a stable n-type semi-insulator. And a monocrystal ingot must be thermally stable since it is subjected to heat treatments in the temperature range from 750° C. to 950° C. in the subsequent semiconductor device manufacturing processes. To avoid changes in electrical properties such as resistivity during the later heat treatments in the semiconductor device manufacturing processes, the monocrystal needs to be subjected to another heat treatment after the first-step heat treatment. In order to stabilize the monocrystal against the later heat treatments, this second-step heat treatment should adopt temperatures in the range from 750° C. to 950° C. which are equivalent to the temperatures experienced by the monocrystal during the heat treatments in the semiconductor device manufacturing process. The length of the second-step heat treatment should be 30 minutes or longer, and after this the monocrystal should be forcibly cooled.

After reducing the density of the precipitation pits to zero by conducting the first-step heat treatment at temperatures higher than 1050° C., the monocrystal of gallium arsenide was subjected to the second-step heat treatment. Thus-treated monocrystal was examined and it was found that the difference between the concentration of EL2 in the vicinity of the seed and that in the tail portion was much smaller than the difference was in the case of the ingot of Table 2. It was also observed that the electric resistivity was almost perfectly uniform throughout the ingot. The inventors came to believe from the results in Table 2 that the small difference between the concentration of EL2 in the vicinity of the seed (Sample F) and that in the tail portion (Sample T) is essentially attributable to the ununiform distribution of the microprecipitates in the monocrystal ingot with respect to the crystal growth direction.

THE EFFECT OF COOLING RATE

It is necessary to adopt a cooling rate of 10°–200° C./minute in the cooling operation conducted between the first-step heat treatment and the second-step heat treatment in order to prevent recurrence of the microprecipitation. If a cooling rate of 0.1° C./min is adopted, for example, the microprecipitation is inevitable. The second-step heat treatment and the pursuant rapid cooling are essential so as to obtain a semi-insulator having an electric resistivity of 10$^7$ Ωcm or higher, and if the cooling rate is as low as 0.1° C./minute, for example, the semi-insulating property is largely lost, even though the material becomes n-type.

As is described above, a monocrystal ingot grown in the conventional manner tends to have an unfavorable characteristic, which is that its various properties are not uniform and consistent throughout its body due to the uneven thermal history it inevitably experiences. However, by subjecting such an ingot to an appropriate heat treatment conducted at temperatures in the vicinity of the melting point of the ingot, by cooling the ingot at an expedited rate, and then by once more subjecting the ingot to a second-step heat treatment followed by another quick cooling, it is possible to improve the ingot such that the ingot displays no ununiformity or inconsistency in the important properties such as resistivity, in the direction of the axis of the ingot growth, and also thus-improved monocrystal ingot retains good semi-insulating property, which is a property essential to the precision manufacturing of semiconductor devices.

The heat treatments can be effectively applied to a gallium arsenide monocrystal ingot as it is or after the ingot is cut into slices, i.e., substrates. Preferably, the heat treatments are applied to the sliced monocrystal substrates all at a time, since it is easier to effect uniform heating with the substrates than with the thick ingot, and also the substrates can be cooled quickly and uniformly, whereas it takes longer time to cool the ingot because the inside of the ingot is less responsive to the cooling temperatures. Therefore, the quenching effect of rapid cooling is greater with the sliced substrates than with the ingot in the same cooling procedure, and furthermore in the case of the substrates, a bolder choice of cooling rate is possible. The upper limit for the cooling rate is determined based on the considerations of preventing distortion and destruction of the monocrystal rod or substrate due to the thermal shock during the quick cooling operation, and also of preventing degradation of crystallinity due to slipping. Special care must be taken during the cooling operation after the first-step heat treatment when the temperature has been raised to the level of the melting point of the monocrystal, lest the gallium arsenide monocrystal rod or substrate should be distorted and thereby undergo degradation in crystallinity and destruction.

It is also possible to obtain the effect of the invention, when the monocrystal is cooled to room temperature after the first-step heat treatment, and then the monocrystal is heated again to go through the second-step heat treatment.

DESCRIPTION OF THE PREFERRED EXAMPLE

Referring to the attached drawings, an example of the invention shall be described hereinbelow.

Figure 1:
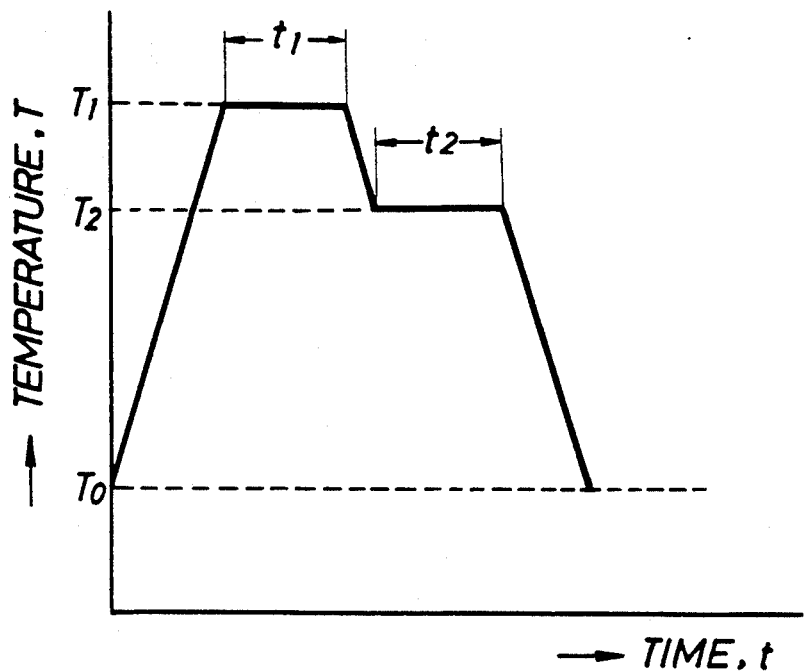
FIG. 1 shows a diagram representing the temperature vs. time control program in accordance with the heat treatment method of the invention.
Figure 3:
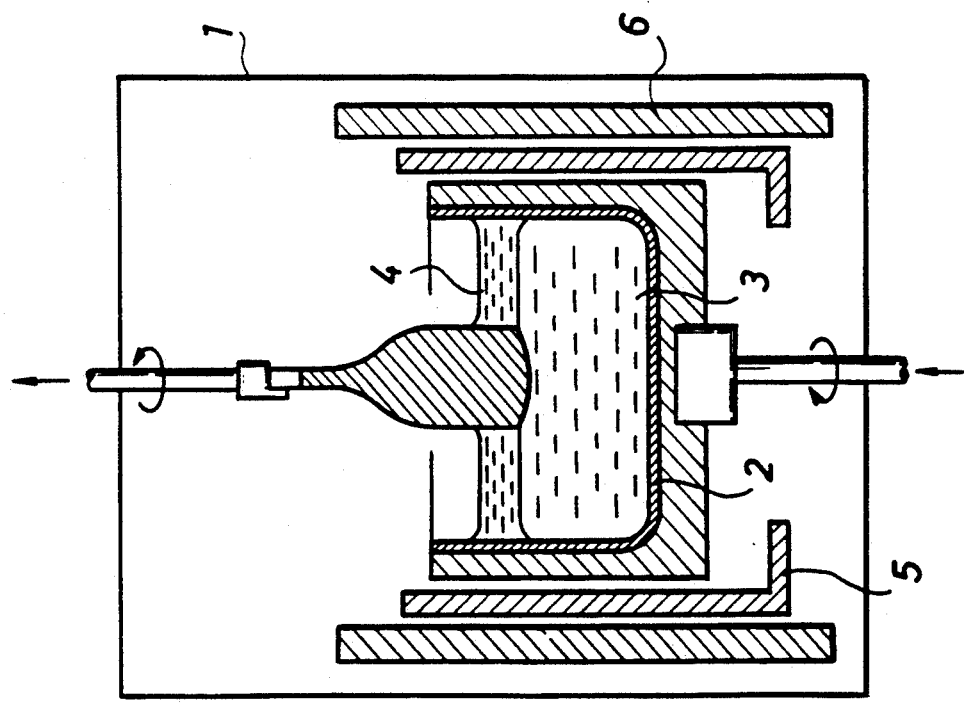
FIG. 3 is a vertical sectional view depicting a crystal pulling apparatus adapted for liquid encapsulated Czochralski (LEC) method.
Figure 4:
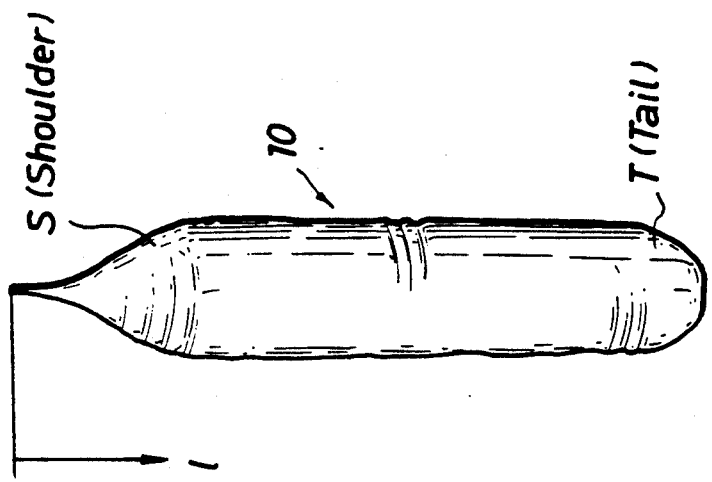
FIG. 4 is a perspective view of a gallium arsenide monocrystal ingot.
Figure 5:
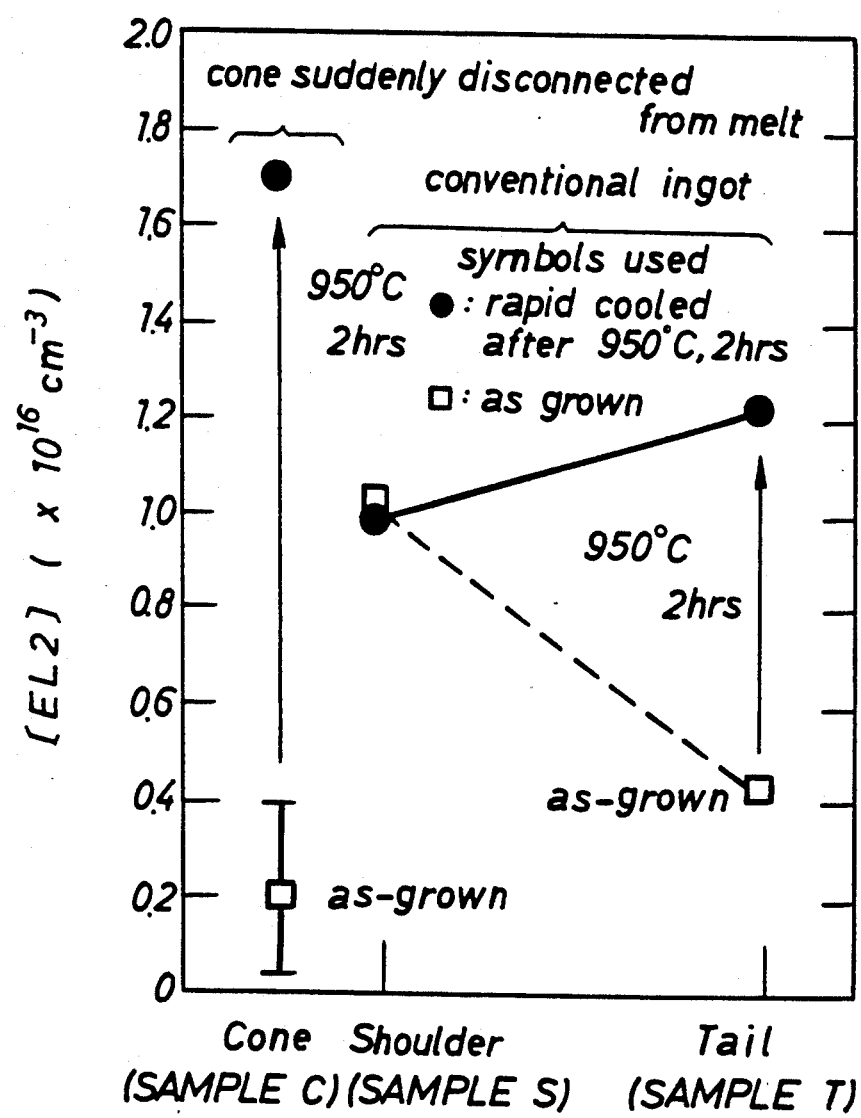
FIG. 5 is a chart showing the changes in the concentration of EL2 in the two gallium arsenide monocrystal rods, one being grown in the conventional manner and the other in a manner such that the crystal cone is quickly disconnected from the melt, before and after the heat treatment of 950° C. for two hours with rapid cooling is applied.

In a preferred example of the invention, a gallium arsenide monocrystal rod 10 grown by the LEC method in a crystal pulling apparatus shown in FIG. 3 was sliced into thin circular plates. The first-step heat treatment was applied to the monocrystal plates by a heater. Referring to FIG. 1, the heating temperature applied to the monocrystal plates was raised from room temperature $T_0$ to a predetermined temperature $T_1$, which was 1100° C. in this example. The temperature was maintained at 1100° C. for a predetermined time length $t_1$, which was five hours. Then the temperature was caused to drop to a predetermined temperature $T_2$ (950° C.) at a cooling rate of about 100° C./min.

Thereafter, the gallium arsenide monocrystal was subjected to the second-step heat treatment which comprises heating the gallium arsenide monocrystal at $T_2$ (950° C.) for a predetermined time length $t_2$ (two hours in this example). Then, the temperature was again caused to drop sharply at a cooling rate of about 100° C./min until it reaches 300° C.

Figure 2:
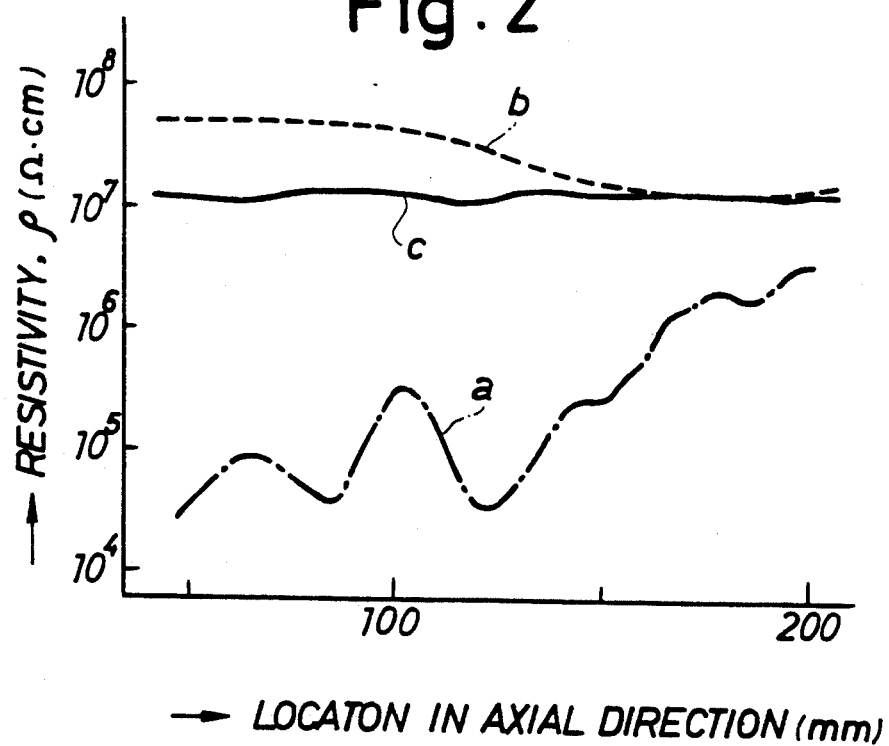
FIG. 2 shows a graph wherein the resistivity of the gallium arsenide monocrystal rod is plotted with respect to the location in the axial direction of the rod.

In FIG. 2, the curve a represents the profile of electric resistivity $\rho$ in the axial direction of the monocrystal as-grown ingot taken after the ingot was pulled up from the melt; the curve b represents the profile of electric resistivity $\rho$ in the axial direction of the monocrystal ingot taken after the ingot was pulled up and subjected to the second-step heat treatment only (i.e., no application of the first-step heat treatment); and the curve e represents the profile of electric resistivity $\rho$ in the axial direction of the monocrystal ingot taken after the ingot was pulled up and subjected to both the first- and second-step heat treatments. As is apparent from FIG. 2, by virtue of the two-step heat treatment of the invention, the monocrystal ingot 10 obtained highly even resistivity profile along the axis of the ingot growth. Although FIG. 2 shows only the profiles of electric resistivity $\rho$, other properties such as the concentration of EL2 and the density of microprecipitates were found to be highly consistent along the growth axis of the monocrystal ingot. Especially, the precipitation pit density was virtually zero throughout the length of the ingot.

Therefore, the method of the invention was found to be effective in leveling the variation in crystal property along the axis of the monocrystal ingot, and thus effective to substantially eliminate the difference between the values of various properties at one end of the ingot and those at the other end. As a result, the integrated circuits (IC) manufactured on the gallium arsenide monocrystal substrate of the invention can attain very high performance and precision.

According to the invention, therefore, the first-step heat treatment initializes the quality of the gallium arsenide monocrystal ingot, that is, the treatment renders the quality of the monocrystal ingot almost as it was immediately after the ingot was solidified after being pulled up from the melt. The subsequent second-step heat treatment stabilizes the electric properties of the ingot and imparts semi-insulating property to it. As a result of the combined effect of the first-step and the second-step heat treatments, the microprecipitation pit density becomes zero throughout the monocrystal ingot and thus it is possible to obtain a gallium arsenide monocrystal of excellent and uniform crystal property along the axis of crystal growth. The invention therefore enables manufacture of semi-conductor chips having high and accurate electric performance.

What is claimed is:

1. A semiconductor device made from an indium-doped dislocation-free gallium arsenide monocrystal which has a low carbon concentration of $2 \times 10^{15}$ cm$^{-3}$ or lower and which is grown in a liquid encapsulated Czochralski method, and then subjected to a heat-treatment process which comprises the steps of:
   (i) heating said monocrystal to a temperature between 1050° C. and 1200° C. for at least 30 minutes;
   (ii) cooling said monocrystal to a temperature of 950° C. or lower at a cooling rate of from 10° C. per minute to 200° C. per minute;
   (iii) heating said monocrystal to a temperature between 750° C. and 950° C. for at least 30 minutes; and
   (iv) cooling said monocrystal to a temperature of 300° C. or lower at a cooling rate of from 10° C. per minute to 200° C. per minute.

* * * * *